(12) United States Patent
Uchiyama

(10) Patent No.: US 7,184,013 B2
(45) Date of Patent: Feb. 27, 2007

(54) SEMICONDUCTOR CIRCUIT IN WHICH POWER CONSUMPTION IS REDUCED AND SEMICONDUCTOR CIRCUIT SYSTEM USING THE SAME

(75) Inventor: Yoshinori Uchiyama, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 710 days.

(21) Appl. No.: 09/893,598

(22) Filed: Jun. 29, 2001

(65) Prior Publication Data

US 2002/0003242 A1 Jan. 10, 2002

(30) Foreign Application Priority Data

Jul. 3, 2000 (JP) ............................. 2000-201095

(51) Int. Cl.
*G09G 3/36* (2006.01)
(52) U.S. Cl. ..................... 345/100; 377/67; 377/72
(58) Field of Classification Search .......... 345/98–100, 345/103, 204, 213; 349/149–152; 327/91–96; 377/67, 72
See application file for complete search history.

(56) References Cited

U.S. PATENT DOCUMENTS

| | | | | | |
|---|---|---|---|---|---|
| 4,672,647 | A | * | 6/1987 | Yamaguchi et al. | 377/77 |
| 5,270,696 | A | * | 12/1993 | Shin et al. | 345/204 |
| 5,313,222 | A | * | 5/1994 | Lee | 345/100 |
| 5,589,785 | A | * | 12/1996 | Garavan | 327/63 |
| 5,680,149 | A | * | 10/1997 | Koyama et al. | 345/98 |
| 5,793,363 | A | * | 8/1998 | Takuwa | 345/205 |
| 5,801,674 | A | * | 9/1998 | Shimizu | 345/103 |
| 5,903,260 | A | * | 5/1999 | Imamura | 345/211 |
| 5,977,944 | A | * | 11/1999 | Kubota et al. | 345/100 |
| 6,049,321 | A | * | 4/2000 | Sasaki | 345/99 |
| 6,181,312 | B1 | * | 1/2001 | Sekine | 345/98 |
| 6,211,849 | B1 | * | 4/2001 | Sasaki et al. | 345/90 |
| 6,266,041 | B1 | * | 7/2001 | Cairns et al. | 345/100 |
| 6,268,842 | B1 | * | 7/2001 | Yamazaki et al. | 345/98 |
| 6,295,046 | B1 | * | 9/2001 | Hebiguchi | 345/100 |
| 6,300,928 | B1 | * | 10/2001 | Kim | 345/92 |
| 6,392,619 | B1 | * | 5/2002 | Nitta et al. | 345/87 |
| 6,426,743 | B1 | * | 7/2002 | Yeo et al. | 345/213 |
| 6,456,271 | B1 | * | 9/2002 | Tamai et al. | 345/100 |
| 6,480,180 | B1 | * | 11/2002 | Moon | 345/98 |
| 6,590,559 | B2 | * | 7/2003 | Takabayashi et al. | 345/99 |
| 6,625,207 | B1 | * | 9/2003 | Nitta et al. | 375/219 |
| 6,653,999 | B2 | * | 11/2003 | Motegi et al. | 345/100 |

(Continued)

FOREIGN PATENT DOCUMENTS

JP 9-27192 1/1997

(Continued)

*Primary Examiner*—Sumati Lefkowitz
*Assistant Examiner*—Ke Xiao
(74) *Attorney, Agent, or Firm*—McGinn IP Law Group, PLLC

(57) ABSTRACT

A semiconductor circuit system includes a first signal line and n circuit sections (n is an integer equal to or more than 2), each of which has an input terminal and an output terminal. The input terminals of predetermined k ones (k is an integer satisfying $2 \leq k < n$) of the n circuit sections are connected to the first signal line, and the output terminal of a m-th one ($1 \leq m \leq n-k$) of the n circuit sections is connected to the input terminal of a (m+k)-th one of the n circuit sections.

12 Claims, 10 Drawing Sheets

U.S. PATENT DOCUMENTS

2002/0180685 A1 * 12/2002 Itakura et al. .............. 345/100

FOREIGN PATENT DOCUMENTS

| JP | 9-230829 | 9/1997 |
| JP | 10-039823 | 2/1998 |
| JP | 11-134893 | 5/1999 |
| JP | 11-249626 | 9/1999 |
| JP | 11-273341 | 10/1999 |

* cited by examiner

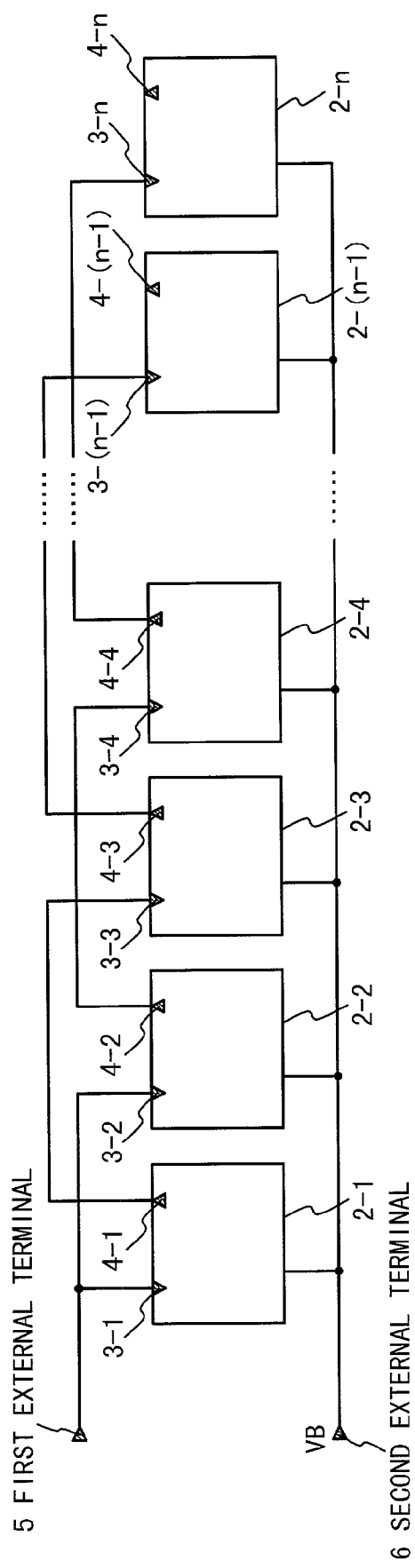

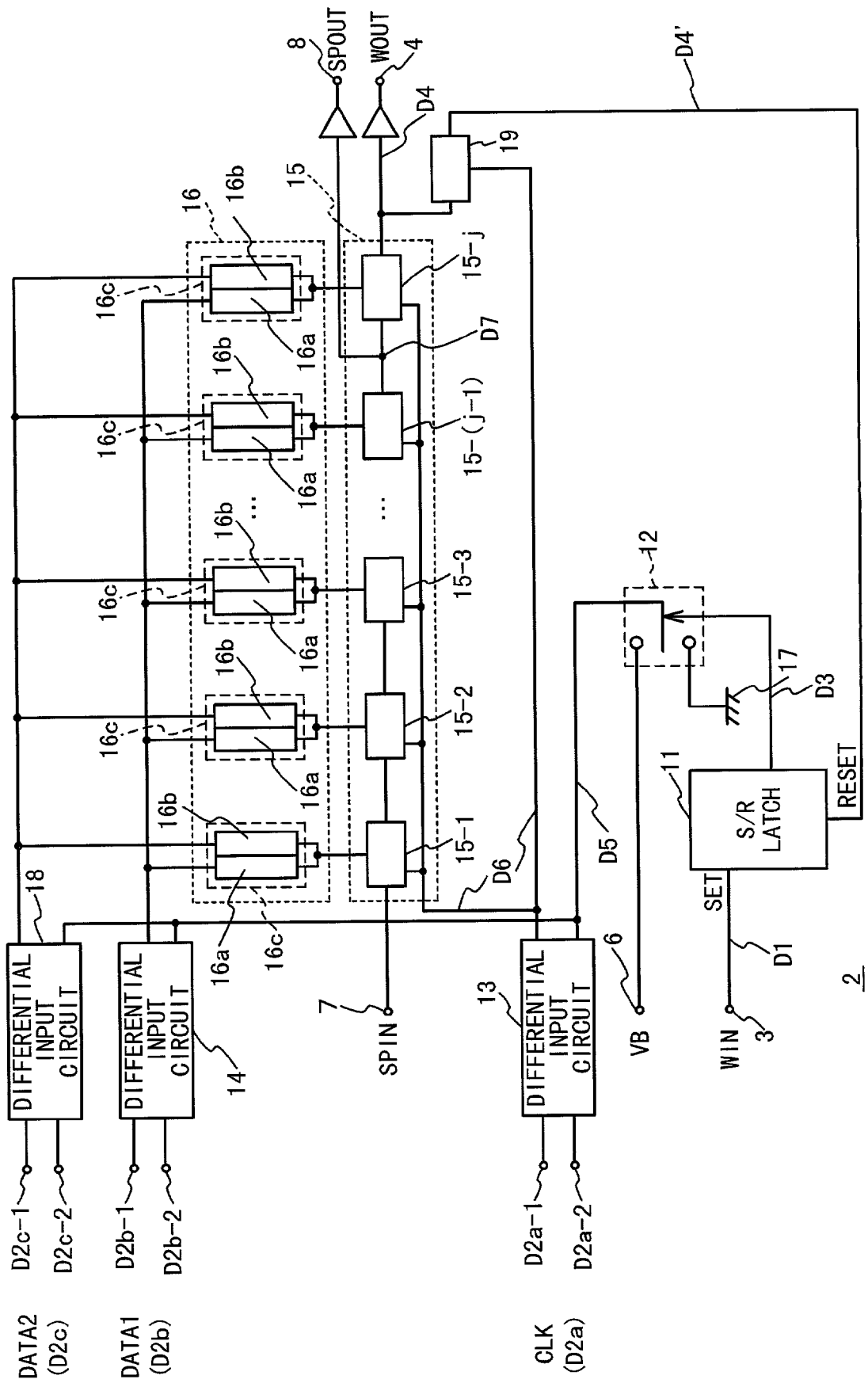

SEMICONDUCTOR CIRCUIT IN WHICH POWER CONSUMPTION IS REDUCED AND SEMICONDUCTOR CIRCUIT SYSTEM USING THE SAME

BACKGROUND OF THE INVENTION

1. Field of the Invention

The present invention relates to a semiconductor circuit, in which power consumption can be reduced, and a semiconductor circuit system using the same.

2. Description of the Related Art

Display apparatuses such as a liquid crystal display apparatus and a plasma display apparatus are widely used. In such a display apparatus, it is desired to reduce power consumption.

FIG. 1 shows the structure of a conventional liquid crystal display apparatus. Referring to FIG. 1, the conventional liquid crystal display apparatus 101 is composed of a display device 102, a vertical drive unit 103 and a horizontal drive unit 104.

The display device 102 is a liquid crystal panel section which is conventionally known. The liquid crystal panel section has X rows of gate bus lines (not shown) extending in a horizontal direction and Y columns of data bus lines (not shown) extending in a vertical direction. A plurality of pixels are provided in areas surrounded by those lines. Each pixel is connected with one gate bus line and one data bus line. Each pixel is composed of a pixel electrode and a switching element such as a field effect transistor. The gate of the switching element is connected with the gate bus line, a source thereof is connected with the data bus line, and a drain thereof is connected with the pixel electrode.

The vertical drive unit 103 has a function to scan the gate bus lines, and the horizontal drive unit 104 has a function to control the voltage level of each of the data bus lines.

Next, an operation of the conventional liquid crystal display apparatus will be described below. The vertical drive unit 103 scans gate bus lines from the top line to the bottom line, and the horizontal drive unit 104 controls the voltage level of the data bus line connected with the pixel based on pixel data. Thus, the pixel which is connected with the gate bus line scanned by the vertical drive unit 103 can display the pixel data.

FIG. 2 shows the structure of the horizontal drive unit 104. Referring to FIG. 2, the horizontal drive unit 104 is composed of a plurality of horizontal drive circuits 111-h (h=1, 2, 3, ..., n) which are connected with an input terminal 112. When the voltage level of an input signal D101 supplied from the input terminal 112 is high, all the horizontal drive circuits 111-h are driven and activated FIG. 3 shows the structure of the conventional horizontal drive circuit 111-h. Referring to FIG. 3, the conventional horizontal drive circuit 111 is composed of a first differential input circuit 113, a second differential input circuit 114, a third differential input circuit 118, a first register circuit 115 and a second register circuit 116. Also, the conventional horizontal drive circuit 111-h has a start pulse input terminal 119 to which a start pulse signal is supplied, and a start pulse output terminal 120 to output the start pulse signal. The start pulse signal is used to establish synchronization when the first register circuit 115 and the second register circuit 116 take in data signals D102b and D102c.

The first differential input circuit 13 is connected with the input terminal 112, clock signal input terminals D102a-1 and D102a-2 and a plurality of flip-flops 115-i (i=1 to j) of the first shift register circuit 115. The first differential input circuit 113 operates when the voltage value of the input terminal 112 is VB (VB>0). The clock signal D102a is supplied to the first differential input circuit 113 from the clock signal input terminals D102a-1 and D102a-2. Also, when the clock signal D102a is supplied, the first differential input circuit 13 supplies the clock signal D102a to the plurality of flip-flops 115-i.

The second differential input circuit 114 is connected with the input terminal 112, data signal input terminals D102b-1 and D102b-2 and first data registers 116a of the second register circuit 116. The first data signal D102b is supplied from the data signal input terminals D102b-1 and D102b-2 to the second differential input circuit 114. The second differential input circuit 114 is activated when the voltage value of the input terminal 112 is VB (VB>0). Also, the second differential input circuit 114 supplies a signal corresponding to the first data signal D102b to the first data registers 116a when the first data signal D102b is supplied.

The third differential input circuit 118 is connected with the input terminal 112, data signal input terminals D102c-1 and D102c-2 and the second data registers 116b of the second register circuit 116. The third differential input circuit 118 is activated when the voltage value of the input terminal 112 is VB (VB>0). The second data signal D102c is supplied to the third differential input circuit 113 from the data signal input terminals D102c-1 and D102c-2. Also, the third differential input circuit 118 supplies the second data signal D102c to the second data registers 116b when the second data signal D102c is supplied.

The first register circuit 115 is connected with the first differential input circuit 113, the start pulse input terminal 119 and the start pulse output terminal 120.

The first register circuit 115 is composed of the plurality of flip-flops 115-i. Also, the flip-flops 115-i are connected with the first differential input circuit 113. Moreover, each of the flip-flops 115 is connected with a corresponding one of sets of a first data register 116a and a second data register 116b in the second register circuit 116. The plurality of flip-flops 115-i are cascade-connected to form a shift register, and delays the start pulse signal one clock by one clock. The start pulse input terminal 119 is connected with the flip-flop 115-1 as the first end of this cascade connection, and the start pulse output terminal 120 is connected with the flip-flop 115-(j−1).

Next, the operation of the plurality of flip-flops 115-i will be described below.

First, the start pulse signal is supplied from the start pulse input terminal 119 to the flip-flop 115-1. Then, the clock signal D102a is supplied from the first differential input circuit 113 to each of the flip-flops 115-i. When the start pulse signal is supplied, the flip-flop 115-1 generates one pulse signal in response to the rising edge of the clock signal D102a and supplies the pulse signal to the corresponding set of the first data register 16a and the second data register 116b. Then, the flip-flop 115-1 outputs a shift signal to the flip-flop 115-2 as a next flip-flop before a next pulse of the clock signal D102a rises up.

Also, when the shift signal is supplied from the flip-flop 115-(p−1) (p is an integer to satisfy $2 \leq p \leq =j-1$), the flip-flop 115-p generates one pulse signal, and supplies the pulse signal to the corresponding set of the first data register 116a and the second data registers 116b. Then, the flip-flop 115-p outputs a shift signal to the flip-flop 115-(p+1) before a next pulse of the clock signal D102a rises up.

Also, when a shift signal is supplied from the flip-flop 115-(j−2), the flip-flop 115-(j−1) generates one pulse signal, and supplies the pulse signal to the corresponding set of the first data register 116a and the second data register 116b. Also, the flip-flop 115-(j−1) outputs a shift signal to the flip-flop 115-j and the start pulse output terminal 120 before a next pulse of the clock signal D102a rises up.

In addition, when a shift signal is supplied from flip-flop 115-(j−1), the flip-flop 115-j generates one pulse signal, and supplies the pulse signal to the corresponding set of the first data register 116a and the second data register 116b which are connected with the flip-flop 115-j.

The second register circuit 116 is connected with the second differential input circuit 114, the third differential input circuit 118 and the first register circuit 115. The second register circuit 116 is composed of register sections 116c for the same number as the number of flip-flops 115-i. Here, each of the register sections 116c is composed of the first data register 116a and the second data register 116b. The respective register sections 116c are connected with the flip-flops 115-i, respectively.

Next, an operation of each register section 116c will be described below. First, the pulse signal is supplied from the flip-flop 115-i to a corresponding one of the register sections 116c, respectively. The first data register 116a in the corresponding register section 116c latches a signal corresponding to the first data signal D102b supplied from the second differential input circuit 114 at the timing of the pulse signal supplied from the corresponding flip-flop 115-i. Also, the second data register 116b in the corresponding register section 116c latches a signal corresponding to the second data signal D102c supplied from the third differential input circuit 118 at the same timing.

Next, an operation of the horizontal drive circuit 111 will be described below. The start pulse signal is supplied from the start pulse input terminal 119 and is delayed by the flip-flops 115-i as the shift register in response to the edge of the clock signal D102a outputted from the first differential input circuit 113. The data signal corresponding to the data signal D102b is outputted from the second differential input circuit 114 in synchronous with the clock signal D102a. Each data register 116a latches the data signal at the timing of the rising edge of the pulse signal from the flip-flop 115-i.

As described above, when the conventional horizontal drive unit 104 operates, all the horizontal drive circuits 111-h are driven. Also, all the differential input circuits 113, 114 and 118 of the horizontal drive circuit 111-i are activated.

Here, in the conventional horizontal drive circuit, each of the differential input circuits 113, 114 and 118 requires the time of about 500 nanoseconds for a stable operation after the differential input circuit is activated. Also, the time of about 300 nanoseconds is needed to latch the data signals D102b and D102c. For this reasons, in the conventional liquid crystal display apparatus, all the horizontal drive circuits 111-h are driven at the same time for the stable operation of the horizontal drive unit.

In conjunction with the above description, a semiconductor integrated circuit is disclosed in Japanese Laid Open Patent application (JP-A-Heisei 9-27192). In this reference, the semiconductor integrated circuit is composed of an input/output interface which inputs and outputs a signal having a smaller amplitude voltage than a power supply voltage in synchronous with a clock signal. A first input circuit of the input/output interface receives an external clock signal and is composed of differential MOSFETs having a gate to which the small amplitude signal and a reference voltage having a level of a half of the small amplitude, and a current source MOSFET connected to common sources of the differential MOSFETs and operating in an ordinary state. Thus, the first input circuit produces an internal signal having amplitude corresponding to the power supply voltage from the small amplitude signal. A second input circuit of the input/output interface receives the small amplitude signal in synchronous with the external clock signal and is composed of differential MOSFETs having a gate to which the small amplitude signal and a reference voltage having a level of a half of the small amplitude, an input section including a current source MOSFET connected to common sources of the differential MOSFETs and operating intermittently based on an internal clock signal taken in by the first input circuit, and a buffer circuit. The input section produces an internal signal having the amplitude corresponding to the power supply voltage from the small amplitude signal. The input section carries out a sampling operation to the internal signal in response to the internal clock signal. The buffer circuit holds the sampled signals.

Also, a source driver output circuit is disclosed in Japanese Laid Open Patent application (JP-A-Heisei 9-230829). In this reference, the source driver output circuit writes a pixel voltage to individual electrodes of liquid crystal elements of a TFT type liquid crystal display apparatus. In the source driver output circuit, a first N-channel FET inputs a display gradation voltage signal and a reference voltage signal and output a differential output of the display gradation voltage signal and the reference voltage signal. A first P-channel FET has a drain connected to the drain of the first N-channel FET, a source connected to a power supply line and a gate to which a constant voltage is biased to always turn on. A second N-channel FET has a drain connected to the drain of the first N-channel FET, a source connected to a ground line and has a current drive capability larger than the first N-channel FET. A second P-channel FET has a drain connected to the drain of the first N-channel FET, a source connected to the power supply line and has a current drive capability larger than the first P-channel FET. A control section connects the gate of the second N-channel FET to the output of a differential input stage to turn on the second N-channel FET when a common electrode is positive to the individual electrode, and turns off the second N-channel FET otherwise, and biases the gate of the second P-channel FET with a constant voltage to turn on the second P-channel FET when the common electrode is negative to the individual electrode, and turns off the second P-channel FET otherwise. Thus, the control section turns on the second N-channel FET and the second P-channel FET exclusively. A pixel voltage is outputted from a connection point to which the drains of the four FETs are connected.

Also, a semiconductor device and a data processing system are disclosed in Japanese Laid Open Patent application (JP-A-Heisei 11-273341). In this reference, a clock synchronous type semiconductor device is composed of a differential input buffer as an input interface circuit of an external signal and a latch circuit. The differential input buffer is composed of a differential input amplifier having a reference voltage as one of inputs and the external signal as the other, a first power switch transistor which supplies a higher power supply voltage to the differential input amplifier, and a second power switch transistor which supplies a lower power supply voltage to the differential input amplifier. A control circuit turns on the first and second power switch transistors in synchronous with a first state of the synchronous clock signal to activate the differential input buffer and to set the latch circuit to an input enable state, and turns off the first and second power switch transistors in synchronous with a second state of the synchronous clock signal to inactivate the differential input buffer and to set the latch circuit to a data latched state.

SUMMARY OF THE INVENTION

Therefore, an object of the present invention is to provide a semiconductor circuit, in which it is possible to reduce power consumption, and a semiconductor system using the same.

Another object of the present invention is to provide a semiconductor circuit in which a stable horizontal driving operation is possible and a semiconductor system using the same.

Still another object of the present invention is to provide a semiconductor circuit whose size can be reduced, and a semiconductor system using the same.

In an aspect of the present invention, a semiconductor circuit system includes a first signal line and n circuit sections (n is an integer equal to or more than 2), each of which has an input terminal and an output terminal. The input terminals of predetermined k ones (k is an integer satisfying $2 \leq k < n$) of the n circuit sections are connected to the first signal line, and the output terminal of a m-th one ($1 \leq m \leq n-k$) of the n circuit sections is connected to the input terminal of a (m+k)-th one of the n circuit sections.

Here, each of the n circuit sections starts an operation in response to a start signal on the first signal line and stops the operation a predetermined time after the start of the operation.

Also, each of the n circuit sections may have a differential input circuit and a register circuit. The differential input circuit may be activated in response to a start signal on the first signal line to start an operation and stops the operation a predetermined time after the start of the operation.

Also, each of the n circuit sections may have a differential input circuit and a register circuit. In this case, the differential input circuit may be activated in response to a start signal on the first signal line to start an operation and stops the operation in response to an output from the register circuit. In this case, the output from the register circuit may be used as the start signal for a next one of the n circuit sections which is connected to the circuit section.

Also, the n circuit sections may be provided for different the semiconductor chips, respectively.

Also, each of the n circuit sections may include a plurality of differential input circuits, a plurality of register circuits connected to output terminals of the plurality of differential input circuits, respectively, and a control circuit connected with at least one of the plurality of register circuits as a specific register circuit and the plurality of differential input circuits. The specific register circuit executes a predetermined operation using a first signal outputted from a corresponding one of the plurality of differential input circuits, and outputs a second signal to the latch circuit when the operation ends. The control circuit activates the plurality of differential input circuits in response to a third signal to operate and stops the operations of the plurality of differential input circuits in response to the second signal.

Also, the plurality of register circuits may include at least one set of registers and at least one set of data registers, and the specific register circuit includes the set of registers.

Also, each of the registers may output a pulse signal to a corresponding one of the data registers when the first signal is supplied, such that data are written in a corresponding one of the data registers, and propagates the first signal to a next one of the registers which is connected to the register. The last one of the registers outputs the first signal as the second signal.

Also, the control circuit may include a first latch which latches the second signal, a second latch which is set in response to the third signal and is reset in response to the second signal latched by the first latch, and a switch which activates the plurality of differential input circuits when the second latch is set and inactivates the plurality of differential input circuits when the second latch is reset.

In another aspect of the present invention, a semiconductor circuit may include a plurality of differential input circuits, a plurality of register circuits connected to output terminals of the plurality of differential input circuits, respectively, and a control circuit connected with at least one of the plurality of register circuits as a specific register circuit and the plurality of differential input circuits. The specific register circuit executes a predetermined operation using a first signal outputted from a corresponding one of the plurality of differential input circuits, and outputs a second signal to the latch circuit when the operation ends. The control circuit activates the plurality of differential input circuits in response to a third signal to operate and stops the operations of the plurality of differential input circuits in response to the second signal.

Here, the plurality of register circuits may include at least one set of registers and at least one set of data registers, and the specific register circuit includes the set of registers.

Also, each of the registers outputs a pulse signal to a corresponding one of the data registers when the first signal is supplied, such that data are written in a corresponding one of the data registers, and propagates the first signal to a next one of the registers which is connected to the register. The last one of the registers outputs the first signal as the second signal.

Also, the control circuit may include a first latch which latches the second signal, a second latch which is set in response to the third signal and is reset in response to the second signal latched by the first latch, and a switch which activates the plurality of differential input circuits when the second latch is set and inactivates the plurality of differential input circuits when the second latch is reset.

BRIEF DESCRIPTION OF THE DRAWINGS

FIG. 4 is a block diagram showing the structure of a semiconductor circuit system according to a first embodiment of the present invention;

FIG. 6 is a block diagram showing the structure of a semiconductor circuit in the system according to the first embodiment of the present invention;

DESCRIPTION OF THE PREFERRED EMBODIMENTS

Figure 1:
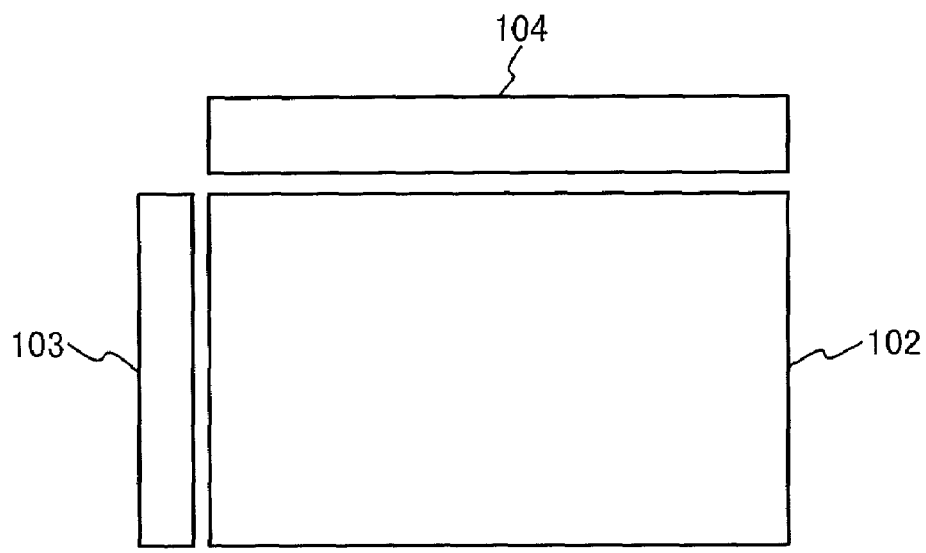
FIG. 1 is a block diagram showing the structure of a conventional liquid crystal display apparatus.

Hereinafter, a semiconductor circuit system using semiconductor circuits of the present invention will be described with reference to the attached drawings. Although the present invention is applied to a horizontal drive type of display apparatus such as a liquid crystal display apparatus and a plasma display monitor, the application of the present invention is not limited to the display apparatus.

FIG. 4 is a diagram showing the structure a semiconductor circuit system according to the first embodiment of the present invention. Referring to FIG. 4, the horizontal drive type of semiconductor circuit system 1 according to the first embodiment of the present invention is composed of a plurality of semiconductor circuits (chips) 2-i (i=1, 2, ..., n: n is an integer equal to or more than 3). Each semiconductor circuit 2 has an input terminal 3-i and an output terminal 4-i.

The first input terminal 3-1 of the semiconductor circuit 2-1 and the first input terminal 3-2 of the semiconductor circuit 2-2 are connected with a first external terminal 5 to which a control signal D1 is externally supplied. The output terminal 4-1 of the semiconductor circuit 2-1 is connected with the input terminal 3-3 of the semiconductor circuit 2-3. The output terminal 4-2 of the semiconductor circuit 2-2 is connected with the input terminal 3-4 of the semiconductor circuit 2-4. Thus, the output terminal 4-m of the semiconductor circuit 2-m ($1 \leq m \leq n-2$) is connected with the input terminal 3-(m+2) of the semiconductor circuit 2-(m+2).

Also, each of the semiconductor circuits 2-i is connected with a second external terminal 6 having the voltage level of VB (VB>0). The control signal D1 is outputted from the output terminal 4-m of the semiconductor circuit 2-m and is supplied to the input terminal 3-(m+2) of the semiconductor circuit 2-(m+2). Also, although it is not shown, a data signal and a clock signal are externally supplied to each of the semiconductor circuits 2-i.

Next, an operation of the semiconductor circuit system according to the first embodiment of the present invention will be described. FIGS. 5A to 5K are time charts showing the operation of the semiconductor circuit system in the first embodiment.

Referring to FIGS. 5A to 5K, a pulse signal P1 is supplied from the first external terminal 5 to the semiconductor circuit system 1. The semiconductor circuits 2-1 and 2-2 are activated in response to the rising edge of the pulse signal P1. When a data writing operation for a predetermined time is ended, the semiconductor circuit 2-1 outputs a pulse signal P2 from the output terminal 4-1 and then pauses or stops the operation. The semiconductor circuit 2-3 is activated in response to the rising edge of the pulse signal P2. When a data writing operation is ended, the semiconductor circuit 2-2 outputs a pulse signal P3 from the output terminal 4-2 and then pauses or stops the operation. The semiconductor circuit 2-4 is activated in response to the rising edge of the pulse signal P3. In the same way, when a data writing operation is ended, the semiconductor circuit 2-m outputs a pulse signal P(m+1) from the first output terminal 4-m and then pauses or stops the operation. The semiconductor circuit 2-(m+2) is activated in response to the rising edge of a pulse signal P(m+1). Also, when a data writing operation is ended, the semiconductor circuit 2-m pauses or stops the operation.

In the semiconductor circuit system according to the first embodiment of the present invention, at most two semiconductor circuits are driven at a time.

FIG. 6 shows the structure of the semiconductor circuit 2-i. Referring to FIG. 6, the semiconductor circuit 2 is composed of a latch circuit 11, a switch section 12-i, a first differential input circuit 13, a second differential input circuit 14, a third differential input circuit 18, a first register circuit 15, a second register circuit 16 and a flip-flop circuit 19.

Also, the semiconductor circuit 2-i has a start pulse input terminal 7 to which the start pulse signal is supplied, and a start pulse output terminal 8 to output the start pulse signal.

Referring to FIGS. 4 and 6, the start pulse input terminal 7 of the semiconductor circuit 2-i is connected with of the start pulse output terminal 8 of the semiconductor circuit 2-(i−2), and the start pulse output terminal 8 of the semiconductor circuit 2-i is connected with the start pulse input terminal 7 of the semiconductor circuit 2-(i+2). However, when the semiconductor circuits are cascade-connected in series, the start pulse input terminal 7 of the semiconductor circuit 2-i may be connected with of the start pulse output terminal 8 of the semiconductor circuit 2-(i−1), and the start pulse output terminal 8 of the semiconductor circuit 2-i may be connected with the start pulse input terminal 7 of the semiconductor circuit 2-(i+1). A start pulse signal is supplied to the start pulse input terminal and used to establish synchronization when data signals D2b and D2c are taken in the second register circuit 16.

The latch circuit 11 is connected with the first input terminal 3 of the semiconductor circuit 2-i, the flip-flop circuit 19 and the switch section 12. The latch circuit 11 receives the control signal D1 from the input terminal 3 and the output D3 of the latch circuit 11 is set to the voltage level VA (a bias voltage and VA>0) of the control signal D3. Also, the latch circuit 11 receives a control signal D4' from the flip-flop circuit 19 and the output D3 of the latch circuit 11 is reset to the zero voltage level.

The switch section 12 is connected with the latch circuit 11 and a node D5. The node D5 is connected with the switch section 12, the first differential input circuit 13, the second differential input circuit 14 and the third differential input circuit 18. Also, the switch section 12 is connected with the second external terminal 6 having the potential of VB (VB>0) and the ground potential 17. The switch section 12 connects the node D5 and either of the second external terminal 6 and the ground potential 17 in response to the control signal D3. In this embodiment, when the voltage level of the control signal D3 is VA, the switch section 12 connects the node D5 and the second external terminal 6 to set the voltage level of the node D5 to VB. Also, when the voltage level of the control signal D3 is zero potential, the switch section 12 connects the node D5 and the ground potential 17 to set the voltage level of the node D5 to zero. Thus, the supply of the clock signal is controlled by the control signal D3.

The first differential input circuit 13 is connected with clock signal input terminals D2a-1 and D2a-2, the node D5 and a node D6. The node D6 is connected with the first differential input circuit 13, the plurality of flip-flop 15-i of the first shift register circuit 15, and the flip-flop circuit 19.

The clock signal D2a is supplied from the clock signal input terminals D2a-1 and D2a-2 to the first differential input circuit 13. The first differential input circuit 13 is activated to start the operation when the voltage level of the node D5 is VB, and stops the operation when the voltage level of the node D5 is zero. Also, the first differential input circuit 13 supplies the node D6 with the clock signal D2a when the clock signal D2a is supplied.

The first data signal D2b is supplied from the data signal input terminals D2b-1 and D2b-2 to the second differential input circuit 14. Also, the second differential input circuit 14 is activated to start the operation when the voltage level of the node D5 is VB. Also, the output section of the second differential input circuit 14 is connected with the first data registers 16a of the second register circuit 16. Also, the second differential input circuit 14 supplies the first data registers 16a with the first data signal D2b when the first data signal D2b is supplied.

The second data signal D2c is supplied from data signal input terminals D2c-1 and D2c-2 to the third differential input circuit 18. Also, the third differential input circuit 18 is activated to start the operation when the voltage level of the node D5 is VB. Also, the output section of the third differential input circuit 18 is connected with the second data registers 16b of the second register circuit 16.

The second data signal D2c is supplied to the third differential input circuit 18 from the data signal input terminals D2c-1 and D2c-2. Also, the third differential input circuit 18 is activated to start the operation when the voltage level of the node D5 is VB. Also, the output section of the third differential input circuit 18 is connected with the second data registers 16b of the second register circuit 16. Also, the third differential input circuit 18 supplies the second data registers 16b with the second data signal D2c when the second data signal D2c is supplied.

The first register circuit 15 is connected with the output terminal 4, the node D6, the start pulse input terminal 7, the start pulse output terminal 8 and the flip-flop circuit 19. The first register circuit 15 is composed of the plurality of flip-flops 15-i. Also, each of the flip-flops 15-i is connected with the node D6. Moreover, each of the flip-flops 15-i is connected with the set of the first data register 16a and the second data register 16b in the second register circuit 16. In addition, the plurality of flip-flops 15-i are cascade-connected to delay the start pulse signal one clock by one clock. The flip-flop 15-1 as the first end of this cascade connection is connected with the start pulse input terminal 7. Also, the flip-flop 15-j as the last one of this cascade connection is connected with the output terminal 4 and the flip-flop circuit 19. Moreover, the start pulse output terminal 8 is connected with the node D7 between the flip-flop 15-(j−1) and the flip-flop 15-j.

Next, an operation of the plurality of flip-flops 15-i will be described below.

First, when the operation of the first differential input circuit 13 is stable, the first differential input circuit 13 supplies the node D6 with the clock signal D2a. Also, the start pulse signal is supplied from the start pulse input terminal 7 to the flip-flop 15-1. The flip-flop 15-1 latches the start pulse signal in response to the rising edge of the clock signal D2a which is supplied to the node D6 and generates one pulse signal. The flip-flop 15-1 supplies the pulse signal to the set of the first data register 16a and the second data register 16b which are connected with the flip-flop 15-1. Next, the flip-flop 15-1 outputs a shift signal to the flip-flop 15-2 before a next pulse of the clock signal D2a rise up.

Also, when a shift signal is supplied from the flip-flop 15-(p−1) (p is an integer satisfying 2≦p≦j−1), the flip-flop 15-p generates one pulse signal, and supplies the pulse signal to the set of the first data register 16a and the second data register 16b which are connected with the flip-flop 15-p. Next, the flip-flop 15-p outputs a shift signal to the flip-flop 15-(p+1) before a next pulse of the clock signal D2a rise up.

When a shift signal is supplied from the flip-flop 15-(j−2), the flip-flop 15-(j−1) generates one pulse signal, and supplies the pulse signal to the set of the first data register 16a and the second data register 16b which are connected with flip-flop 15-(j−1). Next, the flip-flop 15-(j−1) outputs a shift signal to the flip-flop 15-j and the start pulse output terminal 8 before a next pulse of the clock signal D2a rises up. The shift signal is outputted from the start pulse output terminal 8 and is supplied to the start pulse input terminal 7 of another semiconductor circuit 2 as the start pulse signal.

In addition, when a shift signal is supplied from the flip-flop 15-(j−1), the flip-flop 15-j generates one pulse signal, and supplies the pulse signal to the set of the first data register 16a and the second data register 16b which are connected with the flip-flop 15-j. Next, the flip-flop 15-j outputs the shift signal to the output terminal 4 and the flip-flop circuit 19 as a control signal D4 after the pulse signal is outputted and before a next pulse of the clock signal D rises up.

The second register circuit 16 is connected with the second differential input circuit 14, the third differential input circuit 18 and the first register circuit 15. The second register circuit 16 is composed of the register sections 16c for the same number as the number of flip-flops 15-i in the first register circuit. Each register section 16c is composed of one first data register 16a and one second data register 16b. The respective register sections 16c are individually connected with the flip-flops 15-i, respectively. The first data registers 16a and the second data registers 16b in each first register section 16c are connected with one corresponding shift register.

Next, an operation of each register section 16c will be described below. First, a pulse signal is supplied from the flip-flops 15-i which are connected with the register section 16c. The first data signal D2b is supplied from the second differential input circuit 14 at the timing of the pulse signal and is latched by the first data registers 16a of the register section 16c. Also, the second data signal is supplied from the third differential input circuit 18 D2c and is latched by the second data register 16b of the register section 16c.

The flip-flop circuit 19 is connected with the node D6, the first register circuit 15 and the latch circuit 11. The flip-flop circuit 19 outputs a control signal D4' to the latch circuit 11 when the clock signal D2a is supplied from the first differential input circuit 13 to the node D6 and the control signal D4 is outputted from the shift register 15-j of the first register circuit 15.

As shown in the above, the latch 11 receives the control signal D1 from the input terminal 3 to control the first differential input circuit 13, the second differential input circuit 14 and the third differential input circuit 18 to start the operations. Also, the latch 2 receives the control signal D4' from the flip-flop circuit 19 receives the first differential input circuit 13, the second differential input circuit 14 and the third differential input circuit 18 to stop the operations. When a plurality of sets of first register circuits 15 and a plurality of set of second register circuits 16 exist, the flip-flop circuit 19 outputs the control signal D4' to the latch circuit 11 when the control signals D4 from all the sets of first register circuits 15 are obtained. In this case, the latch circuit 11 receive the control signal D4' and controls to stop the operations of the three differential input circuits 13, 14, 18.

Next, the structure and operation of the differential input circuits 13, 14 and 18 will be described.

Figure 7:
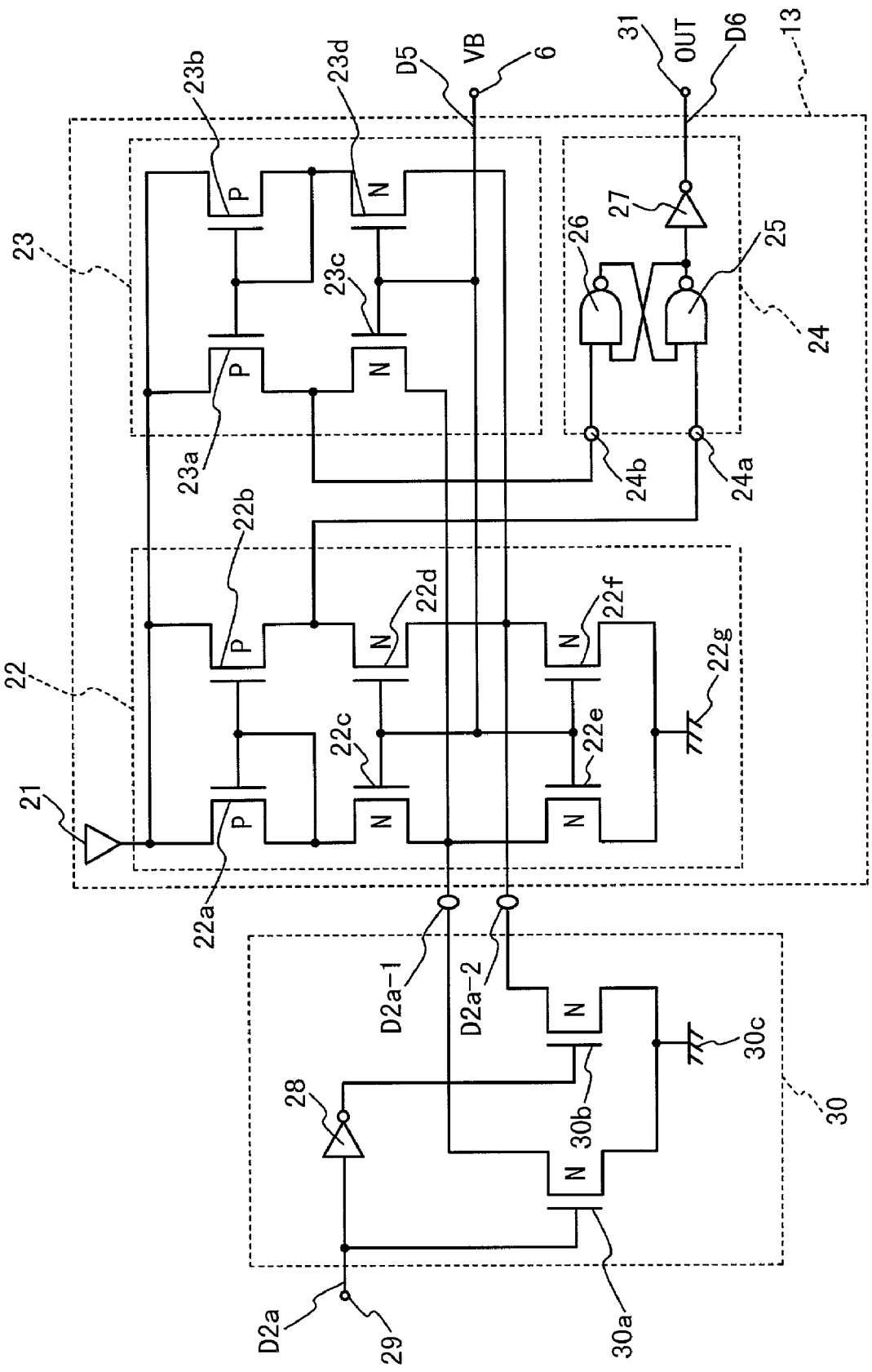
FIG. 7 is a circuit diagram showing the structure of a differential input circuit in the semiconductor circuit according to the first embodiment of the present invention.

First, the structure and operation of the first differential input circuit 13 will be described below. FIG. 7 shows the structure of the first differential input circuit 13 in the horizontal drive type of semiconductor circuit according to the first embodiment of the present invention. Referring to FIG. 7, this embodiment of the first differential input circuit 13 is composed of a terminal 21 that the potential is VDD (VDD>0), a first circuit section 22, a second circuit section 23 and a waveform shaping circuit section 24. Also, the differential input circuit 13 is connected with the drive circuit 30 of the external timing controller through the clock signal input terminals D2a-1 and D2a-2.

The terminal 21 is connected with the first circuit section 22 and the second circuit section 23. The first circuit section 22 is connected with the terminal 21, the waveform shaping circuit section 24, the clock signal input terminal D2a-1 and D2a-2 and the node D5. The clock signal D2a is supplied from the clock signal input terminals D2a-1 and D2a-2. The first circuit section 22 has a first P-channel transistor 22a and a second P-channel transistor 22b. The source of the first P-channel transistor 22a and the source of the second P-channel transistor 22b are connected with the terminal 21. The drain of the first P-channel transistor 22a is connected with the gate of the first P-channel transistor 22a, the gate of the second P-channel transistor 22b and the source of a first N-channel transistor 22c. The drain of the first N-channel transistor 22c is connected with the drain of a third N-channel transistor 22e and the clock signal input terminal D2a-1. The source of the third N-channel transistor 22e is connected with the source of a fourth N-channel transistor 22f and the ground potential 22g. The drain of the fourth N-channel transistor 22f is connected with the drain of a second N-channel transistor 22d and the clock signal input terminal D2a-2. The source of the second N-channel transistor 22d is connected with the drain of the second P-channel transistor 22b and the first terminal 24a in the waveform shaping circuit section 24. Moreover, the gate of the second N channel transistor 22d is connected with the gate of the first N channel transistor 22c, the gate of the third N-channel transistor 22e, the gate of the fourth N-channel transistor 22f and the node D5.

The second circuit section 23 is connected with the terminal 21, the waveform shaping circuit section 24, the clock signal input terminal D2a-1 and D2a-2 and the node D5. The second circuit section 23 has a third P-channel transistor 23a and a fourth P-channel transistor 23b. The source of the third P-channel transistor 23a and the source of the fourth P-channel transistor 23b are connected with terminal 21. The drain of the third P-channel transistor 23a is connected with the drain of a fifth N-channel transistor 23c and a second terminal 24b of a current-voltage converting section 24. The source of the fifth N-channel transistor 23c is connected with the clock signal input terminal D2a-1. The gate of the fifth N-channel transistor 23c is connected with the gate of a sixth N-channel transistor 23d and the node D5. The drain of the sixth N-channel transistor 23d is connected with the clock signal input terminal D2a-2. The source of the sixth N-channel transistor 23d is connected with the gate of the third P-channel transistor 23a and the gate and drain of the fourth P-channel transistor 23b.

The waveform shaping circuit section 24 is connected with the second circuit section 23 at a first terminal 24a and is connected with the first circuit section 22 at a second terminal 24b. Also, the waveform shaping circuit section 24 is connected with the node D6. The waveform shaping circuit section 24 has a first NAND gate 25, a second NAND gate 26 and an inverter circuit 27. The first input terminal of the first NAND gate 25 is connected with the first terminal 24a. The first input terminal of the second NAND gate 26 is connected with the second terminal 24b. Also, the second input terminal of the first NAND gate 25 is connected with the output of the second NAND gate 26. Also, the output of the first NAND gate 25 is connected with the second input terminal of the second NAND gate 26 and the input terminal of the inverter circuit 27. Moreover, the output terminal of the inverter circuit 27 is connected with an external terminal 31 connected with the node D6. The clock signal D2a is supplied to the drive circuit 30 of the external timing controller through a terminal 29. Also, the drive circuit 30 of the external timing controller is connected with the clock signal input terminal D2a-1 and the clock signal input terminal D2a-2.

The drive circuit 30 of the external timing controller is composed of an inverter circuit 28, a seventh N-channel transistor 30a and an eighth N-channel transistor 30b. The internal terminal 29 of the external timing controller is connected with the input terminal of the inverter circuit 28 and the gate of the seventh N-channel transistor 30a. The drain of the seventh N-channel transistor 30a is connected with the clock signal input terminal D2a-1. The source of the seventh N-channel transistor 30a is connected with the ground potential 30c and the source of the eighth N-channel transistor 30b. The gate of the eighth N-channel transistor 30b is connected with the output terminal of the inverter circuit 28. The drain of the eighth N-channel transistor 30b is connected with the clock signal input terminal D2a-2.

Next, an operation of the first differential input circuit 13 in this embodiment will be described. First, the case that the voltage level of the node D5 is zero will be described below. It is supposed that the voltage levels of the gates of the first N-channel transistor 22c, second N-channel transistor 22d, third N-channel transistor 22e and fourth N-channel transistor 22f are low in the first circuit section 22. In this case, therefore, a conductive state is not set between the source and the drain in each of the first N-channel transistor 22c, the second N-channel transistor 22d, the third N-channel transistor 22e and the fourth N-channel transistor 22f. As a result, the voltage level of the first terminal 24a does not change regardless of the ON and OFF states of the seventh N-channel transistor 30a and the eighth N-channel transistor 30b which depend on the change of the voltage level of the internal terminal 29 of the timing controller.

It is supposed that the voltage level of the gates of the fifth N-channel transistor 23c and sixth N-channel transistor 23d are low in the second circuit section 23. In this case, therefore, a conductive state is not set between the source and the drain of each of the fifth N-channel transistor 23c and the sixth N-channel transistor 23d. As a result, the voltage level of the second terminal 24b does not change regardless of the ON and OFF states of the seventh N-channel transistor 30a and the eighth N-channel transistor 30b which depend on the change of the voltage level of the internal terminal 29 of the timing controller. As a result, when the voltage level of the node D5 is zero, the voltage levels of the first terminal 24a and the second terminal 24b are fixed. Thus, an output voltage level of the external terminal 31 of the first differential input circuit 13 is fixed.

Next, the case that the voltage level of the node D5 is VB (VB>0) will be described below. It is supposed that the voltage levels of the gates of the first N-channel transistor 22c, second N-channel transistor 22d, third N-channel transistor 22e and fourth N-channel transistor 22f are VB in the first circuit section 22. In this case, therefore, a conductive state is set between the source and the drain of each of the first N-channel transistor 22c, the second N-channel transistor 22d, the third N-channel transistor 22e and the fourth N-channel transistor 22f.

Next, it is supposed that the voltage levels of the gates of the fifth N-channel transistor 23c and the sixth N-channel transistor 23d are VB in the second circuit section 23. In this case, therefore, a conductive state is set between the source and the drain of each of the third P channel transistor 23c and the fourth P channel transistor 23d. Here, if the clock signal D2a become low, the voltage of the gate of the seventh N-channel transistor 30a becomes high and the voltage of the gate of the eighth N-channel transistor 30b becomes low. Therefore, the conductive state is set between the source and the drain of the seventh N-channel transistor 30a, but the conductive state is not set between the source and the drain of the eighth N-channel transistor 30b. As a result, the voltage level of the clock signal input terminal D2a-1 becomes a zero approximately and the clock signal input terminal D2a-2 becomes open.

In this case, in the first circuit section 22, since the conductive state is set between the source and the drain of the first N-channel transistor 22c, the voltage levels of the gates of the first P-channel transistor 22a and the second P-channel transistor 22b falls. Therefore, the conductive state is set between the source and the drain of each of the first P-channel transistor 22a and the second P-channel transistor 22b. Thus, the first terminal 24a is electrically connected with the terminal 21 and the potential of the first terminal 24a becomes the power supply voltage VDD.

Also, in the second circuit section 23, since a conductive state is set between the source and the drain of the fifth N-channel transistor 23c, the second terminal 24b is connected with the clock signal input terminal D2a-1. Therefore, the potential of the second terminal 24b becomes low.

In the above-mentioned case, in the waveform shaping circuit section 24, because the potential of the second terminal 24b is low, the voltage level of the output terminal of the second NAND gate 26 becomes high. Next, the voltage levels of the output terminal of second NAND gate 26 and the voltage level of the first terminal 24a are high, the voltage level of the output terminal of the first NAND gate 25 becomes low. As a result, the voltage levels of the second input terminal of the second NAND gate 26 and the input terminal of the inverter circuit 27 become low. Thus, the voltage level of the output terminal of the inverter circuit 27 becomes high and the voltage level of the external terminal 31 becomes high.

Next, when the clock signal D2a is low, the voltage of the gate of the seventh N-channel transistor 30a becomes low so that the voltage of the gate of the eighth N-channel transistor 30b becomes high. Therefore, the conductive state is set between the source and the drain of the eighth N-channel transistor 30b, but the conductive state is not set between the source and the drain of the seventh N-channel transistor 30a. Thus, clock signal input terminal D2a-1 becomes open and the voltage level of the clock signal input terminal D2a-2 becomes a zero approximately. In this case, in the first circuit section 22, since the conductive state is set between the source and the drain of the second N-channel transistor 22d, the clock signal input terminal D2a-2 and the first terminal 24a are electrically connected. Therefore, the potential of the first terminal 24a is low.

Also, in the second circuit section 23, since the conductive state is set between the source and the drain of the sixth N-channel transistor 23d, the potentials of the gate of the third P-channel transistor 23a and the gate of the fourth P-channel transistor 23b fall. As a result, the conductive state is set between the source and the drain of each of the third P-channel transistor 23a and the fourth P-channel transistor 23b. Thus, the terminal 21 and the second terminal 24b are electrically connected. Therefore, the potential of the second terminal 24b becomes VDD.

In the above-mentioned case, in the waveform shaping circuit section 24, because the potential of the first terminal 24a is low, the voltage level of the output terminal of the first NAND gate 25 becomes high. Next, since the voltage level of the output terminal of the first NAND gate 25 and the voltage level of the second terminal 24b are high, the voltage level of the output terminal of the second NAND gate 26 becomes low. As a result, the voltage level of the output terminal of the first NAND gate 25 is fixed to the high level. Thus, the voltage level of the input terminal of the inverter circuit 27 becomes high, and the voltage level of the output terminal of the inverter circuit 27 becomes low. As a result, the voltage level of the external terminal 31 becomes low.

Next, the structure and operation of the second differential input circuit 14 will be described below.

The structure and the operation of the second differential input circuit 14 are same as those of the differential input circuit 13 except that the first data signal D2b is supplied from the external terminal 29 and the external terminal 31 is connected to the first data registers 16a of the second register circuit 16.

Next, the structure and operation of the third differential input circuit 18 will be described below. The structure and operation of the third differential input circuit 18 are same as those of the differential input circuit 13 except that the second data signal D2c is supplied from the external terminal 29 and the external terminal 31 is connected with the second data registers 16b of the second register circuit 16.

Next, the horizontal drive type of semiconductor circuit according to the second embodiment of the present invention will be described. The horizontal drive type of semiconductor circuit according to the second embodiment differs from the horizontal drive type of semiconductor circuit according to the first embodiment in the structure of the semiconductor circuit 2.

Figure 8:
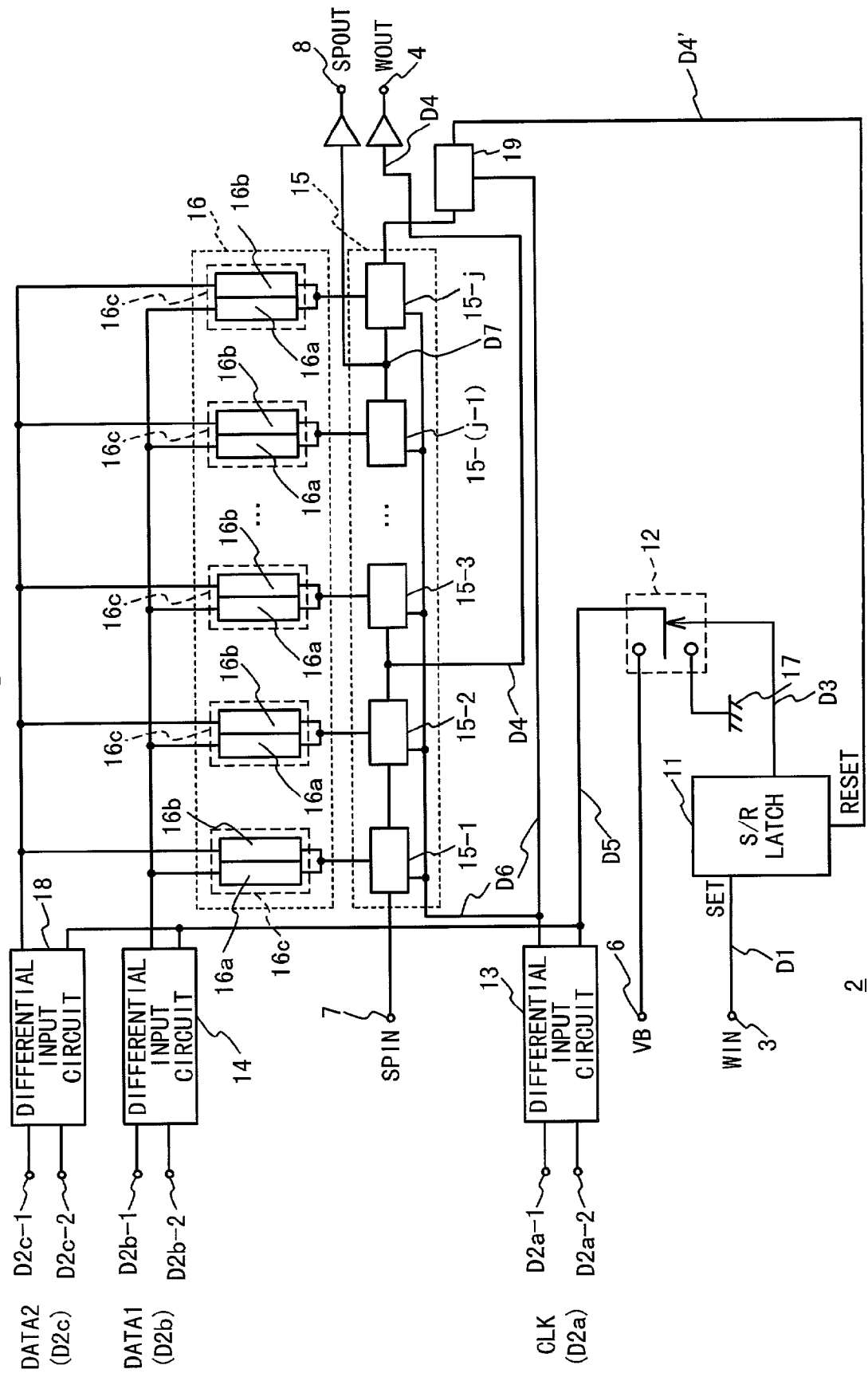
FIG. 8 is a block diagram showing the structure of the semiconductor circuit according to a second embodiment of the present invention.
Figure 9:
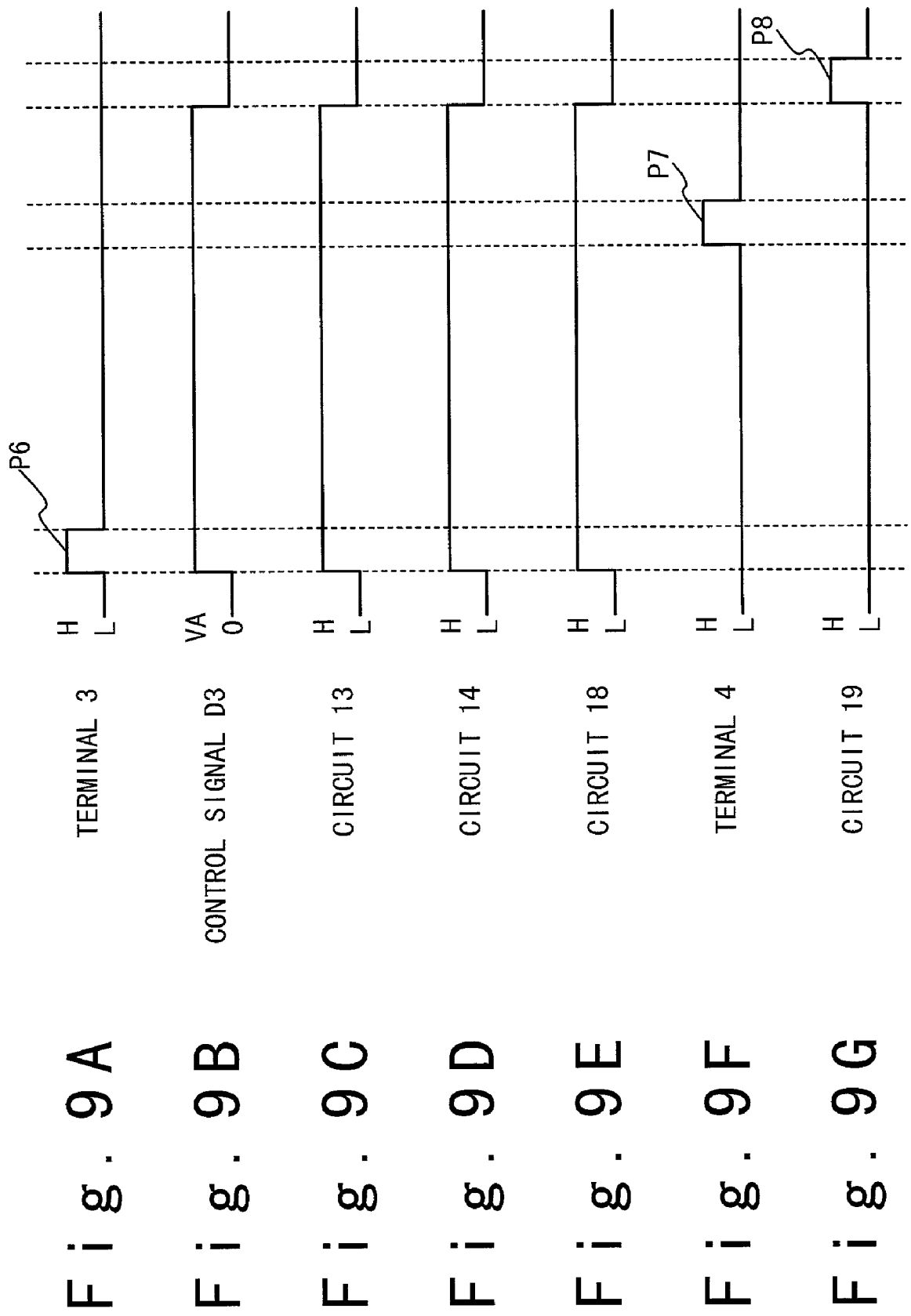
FIGS. 9A to 9G are timing charts showing an operation of the semiconductor circuit system according to the second embodiment of the present invention.

FIG. 8 shows the structure of the semiconductor circuit 2 in the horizontal drive type of semiconductor circuit system according to the second embodiment the present invention. In the semiconductor circuit system of the first embodiment, the output terminal 4 of the semiconductor circuit 2 is connected with the shift register 15-j of the first register circuit 15. In the semiconductor circuit system in the second embodiment, the output terminal 4 of the semiconductor circuit 2 is connected with the output terminal of the shift register 15-q of the first register circuit 15 (q is an integer satisfying $1 \leq q \leq j-1$, and q=2 in the semiconductor circuit 2 of the second embodiment). Other than this point, the semiconductor circuit 2 in the second embodiment has the same structure as the semiconductor circuit 2 in the first embodiment. That is, in the semiconductor circuit 2 in this second embodiment, the output terminal 4 is connected with one of the shift registers of the first register circuit 15 other than the shift register 15-j. The shift register connected with the output terminal 4 is not limited to the shift register 15-2.

Next, the operation of the semiconductor circuit 2 in the horizontal drive type of semiconductor circuit system according to the second embodiment of the present invention will be described below. Referring to FIGS. 9A to 9G, the pulse signal P6 is supplied to the semiconductor circuit 2 from the input terminal 3. The voltage level of the control signal D3 changes into the VA in response to the rising edge of the pulse signal P6. The first differential input circuit 13, the second the differential input circuit 14 and the third differential input circuit 18 start operation when the voltage level of the control signal D3 goes to VA.

Next, when a shift signal is outputted from the flip-flop 15-2 to the output terminal 4, the output terminal 4 outputs a pulse signal P7. The pulse signal P7 as the control signal D4 is possible to be supplied to the other semiconductor circuits 2 in which the input terminal 3 is connected with the output terminal 4.

Next, when a shift signal is outputted from the flip-flop 15-j to the flip-flop circuit 19, the flip-flop circuit 19 outputs a pulse signal P8 as the control signal D4' to the latch circuit 11. The latch circuit 11 sets the voltage level of the control signal D3 to zero in response to the rising edge of the pulse signal P8. The first differential input circuit 13, the second the differential input circuit 14 and the third differential input circuit 18 pause or stops the operation when the voltage level of the control signal D3 goes to zero.

In the horizontal drive type of semiconductor circuit system according to the second embodiment of the present invention, the number of driven semiconductor circuits 2 is at least two, and at most four. However, all the semiconductor circuits are never drive at the same time.

The first the differential input circuit 13 requires the time of 300 to 500 nanoseconds until it can operate stably after the voltage level of the node D5 changes into the high level. Also, the time necessary to write data in the first register circuit 15 and in the second register circuit 16 is equal to or less than 300 nanoseconds. Through the speed-up of the operation of the first register circuit 15 and second register circuit 16, the time necessary to write the data becomes shorter. Therefore, the semiconductor circuit 2 outputs the control signal D1 from the output terminal 4 300 to 500 nanoseconds after the control signal D1 is supplied to the input terminal 3. Also, the semiconductor circuit 2 stops the operation 300 nanoseconds after the control signal D1 is outputted from the output terminal 4. Therefore, three or more semiconductor circuits 2 are never driven at the same time.

In the semiconductor circuit 2 of the second embodiment shown, the latch circuit 11 controls to stop the operation of each of the plurality of the differential input circuits 13, 14 and 18 in response to a pulse signal P8 from the flip-flop circuit 19. When a plurality of first register circuits 15 exist, the flip-flop circuit 19 outputs a pulse signal P8 as the control signal D4' to the latch circuit 11 when the shift signals are outputted from the flip-flops 15-j of all the first register circuits 15. In this case, also, the latch circuit 11 controls the plurality of the differential input circuits 13, 14 and 18 to stop the operation in response to the pulse signal P8.

Figure 10:
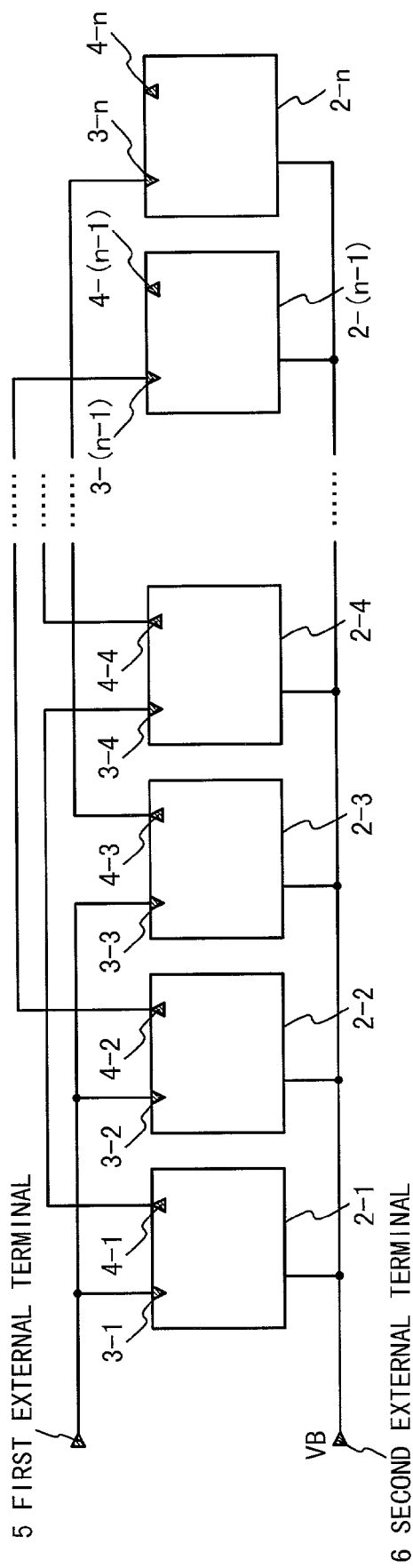
FIG. 10 is a block diagram showing the structure of the semiconductor circuit system according to a third embodiment of the present invention.
Figure 11A:
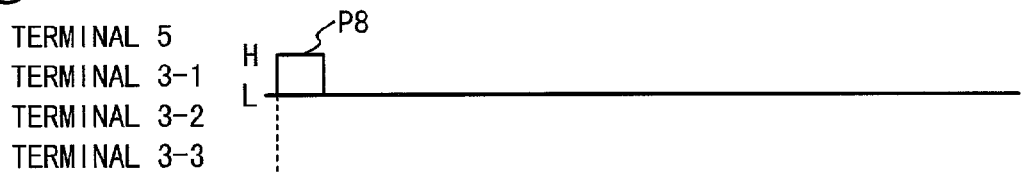
FIGS. 11A to 11K are timing charts showing an operation of the semiconductor circuit system according to the third embodiment of the present invention.
Figure 11B:
Figure 11C:
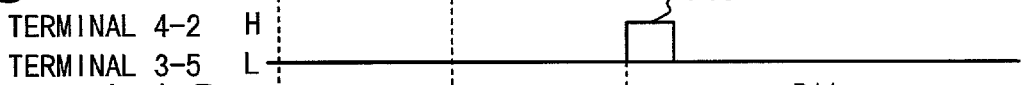
Figure 11D:
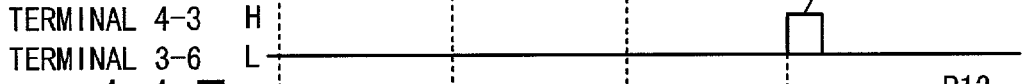
Figure 11E:
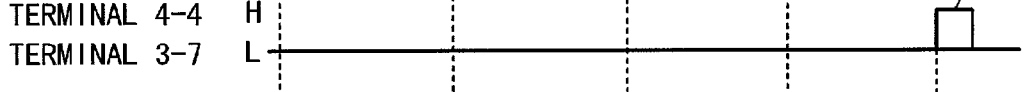
Figure 11F:
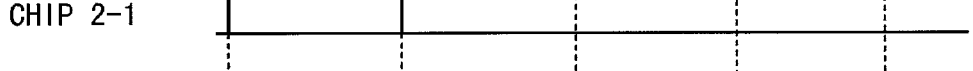
Figure 11G:
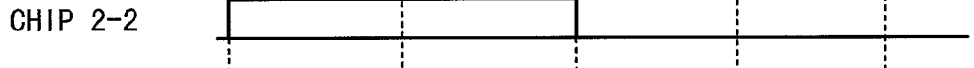
Figure 11H:
Figure 11I:
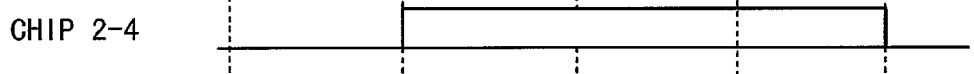
Figure 11J:
Figure 11K:
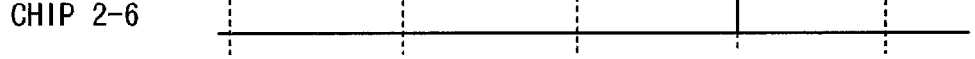

Next, the horizontal drive type of semiconductor circuit system according to the third embodiment of the present invention will be described below. FIG. 10 shows the structure of the horizontal drive type of semiconductor circuit system according to the third embodiment of the present invention.

Referring to FIG. 10, the horizontal drive type of semiconductor circuit 1 according to the third embodiment of the present invention is composed of the plurality of the semiconductor circuits 2-i (i=1, 2, ..., n: n is an integer equal to or more than 3). Each of the semiconductor circuits 2 has the input terminal 3 and the output terminal 4.

The first input terminal 3-1 of the semiconductor circuit 2-1, the first input terminal 3-2 of the semiconductor circuit 2-2 and the first input terminal 3-3 of the semiconductor circuit 2-3 are connected with the first external terminal 5 which the control signal D1 is externally supplied. The first output terminal 4-1 of the semiconductor circuit 2-1 is connected with the input terminal 3-4 of the semiconductor circuit 2-4. The output terminal 4-2 of the semiconductor circuit 2-2 is connected with the input terminal 3-5 of the semiconductor circuit 2-5. The output terminal 4-3 of the semiconductor circuit 2-3 is connected with the input terminal 3-6 of the semiconductor circuit 2-6. The output terminal 4-m of the semiconductor circuit 2-m ($1 \leq m \leq n-3$) is connected with the input terminal 3-(m+2) of the semiconductor circuit 2-(m+3).

Also, each of the semiconductor circuits 2-i is connected with the second external terminal 6 in which the voltage level is VB (VB>0). The control signal D1 is outputted from the output terminal 4-m of the semiconductor circuit 2-m and is supplied to the input terminal 3-(m+3) of the semiconductor circuit 2-(m+3). Also, a data signal and a clock signal (both not shown) are externally supplied to each of the semiconductor circuits 2-i.

Next, an operation of the horizontal drive type of semiconductor circuit system according to the third embodiment of the present invention will be described. FIGS. 11A to 11K are the time charts showing the operation of the horizontal drive type of semiconductor circuit system according to the third embodiment of the present invention. Referring to FIGS. 11A to 11K, a pulse signal P9 is supplied from the first external terminal 5 to the horizontal drive type of semiconductor circuit system 1. The semiconductor circuits 2-i activated in response to the rising edge of the pulse signal P9. When a data writing operation ends, the semiconductor circuit 2-1 outputs a pulse signal P10 from the output terminal 4-1 and pauses or stops the operation. The semiconductor circuit 2-4 is activated in response to the rising edge of pulse signal P10. When a data writing operation ends, the semiconductor circuit 2-2 outputs the pulse signal P10 from the output terminal 4-2 and pauses or stops the operation. The semiconductor circuit 2-5 is activated in response to the rising edge of pulse signal P10. When a data writing operation ends, the semiconductor circuit 2-3 outputs a pulse signal P11 from the output terminal 4-3 and pauses or stops the operation. The semiconductor circuit 2-6 is activated in response to the rising edge of pulse signal P11. In the same way, when a data writing operation ends, the semiconductor circuit 2-m outputs a pulse signal from the output terminal 4-m and pauses or stops the operation. The semiconductor circuit 2-(m+2) is activated in response to the rising edge of the pulse signal outputted from the output terminal 4-m. Also, when a data writing operation ends, the semiconductor circuit 2-m pauses or stops the operation.

In the horizontal drive type of semiconductor circuit system according to the third embodiment of the present invention, at most three semiconductor circuits are driven. The differential input circuit which is provided for the semiconductor circuit 2 used in the horizontal drive type of semiconductor circuit system according to the third embodiment of the present invention and the semiconductor circuit 2 is the same as that which is used in the horizontal drive type of semiconductor circuit system according to the first embodiment of the present invention.

Next, the horizontal drive type of semiconductor circuit system according to the fourth embodiment of the present invention will be described. The horizontal drive type of semiconductor circuit system according to the fourth embodiment of the present invention differs from that of the third embodiment of the present invention in the structure of the semiconductor circuit 2.

The semiconductor circuit 2 which is used in the horizontal drive type of semiconductor circuit system according to the fourth embodiment of the present invention is the same as that which is used in the horizontal drive type of semiconductor circuit system according to the second embodiment of the present invention. Therefore, in the horizontal drive type of semiconductor circuit system according to the fourth embodiment of the present invention, at most six semiconductor circuits 2 are driven at the same time and all the semiconductor circuits 2 are never driven at the same time.

Also, the horizontal drive type of semiconductor circuit system of the present invention is not limited to the embodiments shown in the above. It is sufficient if the horizontal drive type of semiconductor circuit system has the structure shown below. The horizontal drive type of semiconductor circuit system is composed of the plurality of semiconductor circuits 2-i (i=1, 2, . . . , n: n is an integer equal to or more than 3). Each of the semiconductor circuits 2 has the input terminal 3 and output terminal 4. Each of the input terminals 3 of the semiconductor circuits 2-r ($1 \leq r < n$) is connected with the first external terminal 5 in which the control signal D1 is externally supplied. Also, the output terminal 4-s of the semiconductor circuit 2-s ($1 \leq r+s \leq n$) is connected with the input terminal 3-(r+s) of the semiconductor circuit 2-(r+s).

As described above, the present invention has the following advantages.

Figure 2:
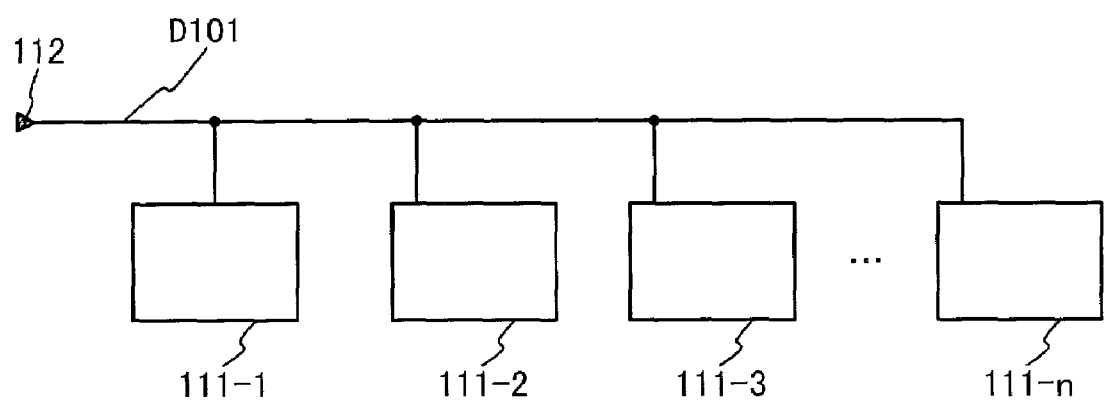
FIG. 2 is a diagram showing the structure of a horizontal drive unit.
Figure 3:
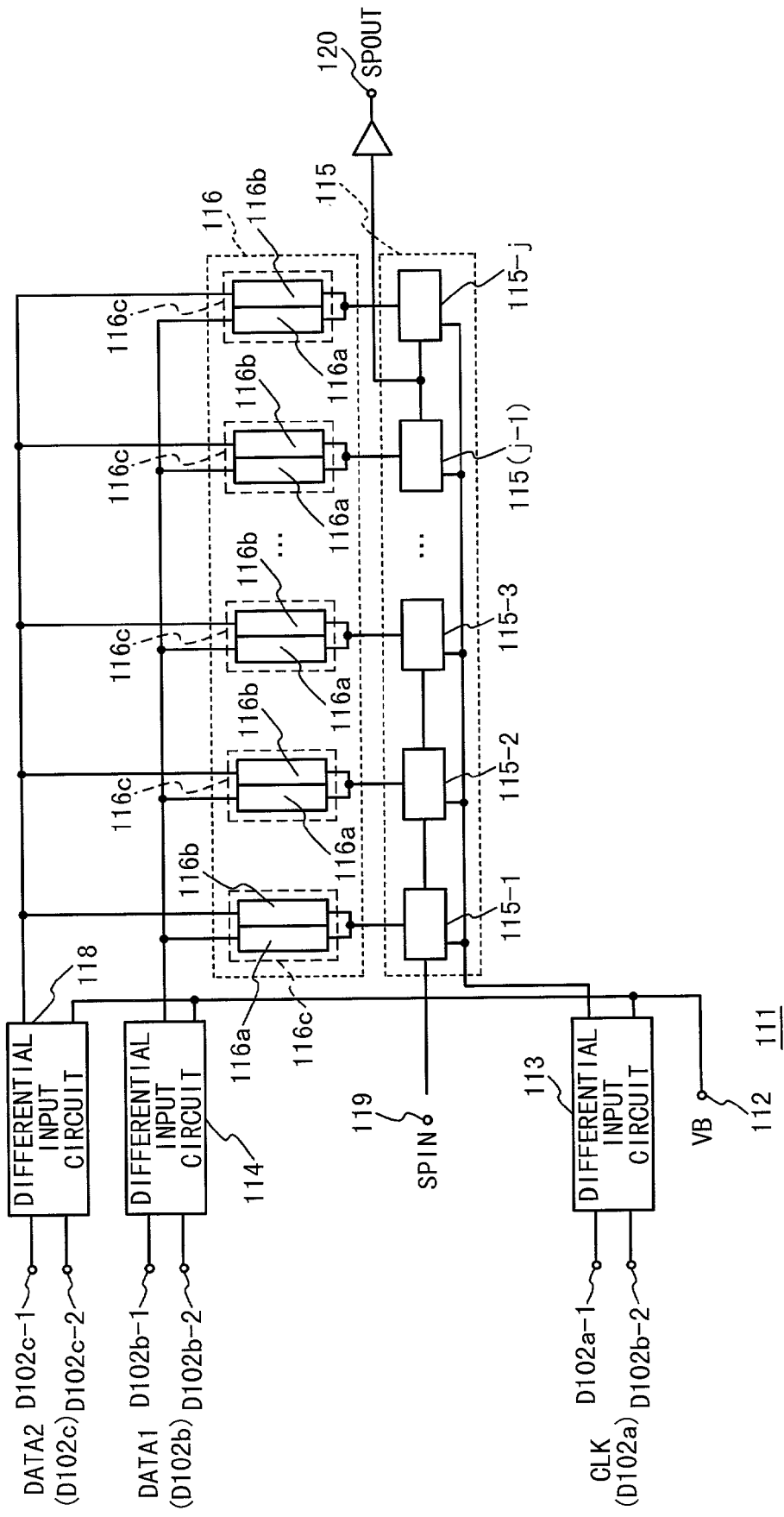
FIG. 3 is a block diagram showing the structure of a conventional horizontal drive circuit.
Figure 5A:
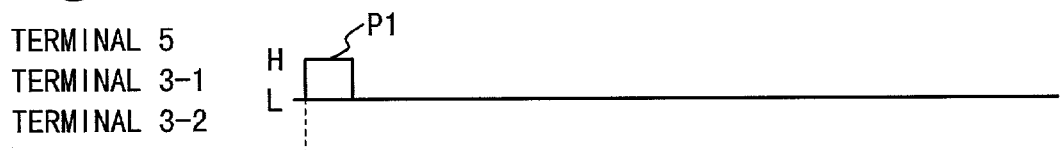
FIGS. 5A to 5K are timing charts showing an operation of the semiconductor circuit system according to the first embodiment of the present invention.
Figure 5B:
Figure 5C:
Figure 5D:
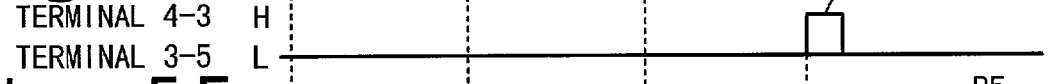
Figure 5E:
Figure 5F:
Figure 5G:
Figure 5H:
Figure 5I:
Figure 5J:
Figure 5K:

The conventional horizontal drive type of semiconductor circuit system is composed of 10 semiconductor circuits. Also, each of the semiconductor circuits has 15 differential input circuits and 15 logic circuit sections. The power consumption of one differential input circuit is 1 mA in a standing-by mode and in an operation mode. Therefore, the consumption current of the differential input circuits of one semiconductor circuit is 15 mA in a standing-by and an operation mode of the semiconductor circuit. Also, the consumption current of the logic circuit section is 10 mA in the operation mode and 0 mA in the standing-by mode. Therefore, when the horizontal drive type of semiconductor circuit system shown in FIG. 2 is drives, the consumption current is (15 mA+10 mA)×10 (the number of circuits) and shown as 250 mA, for all of 10 semiconductor circuits to be driven.

Also, in case of the horizontal drive type of semiconductor circuit system according to the first embodiment of the present invention shown in FIG. 4, only two of the semiconductor circuits are driven, and the consumption current is (15 mA+10 mA)×2 (the number of the chips) and shown as 50 mA. In this way, in the horizontal drive type of semiconductor circuit system of the present invention, the consumption current can be reduced, compared with the conventional horizontal drive type of semiconductor circuit system in which all the semiconductor circuits are driven.

Also, all the semiconductor circuits are always driven in the horizontal drive type of semiconductor circuit system of the present invention. Therefore, it is possible to reduce the drive capability of the drive transistor provided in the timing controller to output a clock signal and a data signal. Specifically, in the horizontal drive type of semiconductor circuit system according to the first embodiment of the present invention, at most two of the semiconductor circuits are only driven at the same time. Therefore, the drive transistor in the timing controller is sufficient to have the drive capability necessary to drive two semiconductor circuits. Also, in the conventional horizontal drive type of semiconductor circuit system shown in FIG. 2, all of 10 semiconductor circuits are driven. Therefore, the drive transistor of the timing controller needs to have the drive capability necessary to drive 10 semiconductor circuits. In the horizontal drive type of semiconductor circuit system of the present invention, the drive transistor of the timing controller is sufficient to have the drive capability of about ⅕ of the drive capability of the drive transistor. As a result, in the horizontal drive type of semiconductor circuit system of the present invention, the size of the transistor can be made small.

What is claimed is:

1. A semiconductor circuit system comprising:
   a first signal line; and
   n circuit sections, where n is an integer greater than 2, each of which includes an input terminal and an output terminal,
   wherein said input terminals of only predetermined k ones of said n circuit sections are connected to said first signal line, where k is an integer equal to or greater than 2 and less than n, and said output terminal of an $m^{th}$ one of said n circuit sections is connected to said input terminal of an $(m+k)^{th}$ one of said n circuit sections, where m is an integer varying between 1 and n−k, thereby k of said n circuit sections are activated at a given time, and
   wherein each of said n circuit sections comprises:
     a plurality of differential input circuits;
     a plurality of register circuits connected to output terminals of said plurality of differential input circuits, respectively; and
     a control circuit including a latch circuit, said control circuit connected with at least one of said plurality of register circuits as a specific register circuit and said plurality of differential input circuits,
     wherein said specific register circuit executes a predetermined operation using a first signal outputted from a corresponding one of said plurality of differential input circuits, and outputs a second signal to said latch circuit when the operation ends, and
     said control circuit activates said plurality of differential input circuits in response to a third signal to operate and stops the operations of said plurality of differential input circuits in response to said second signal.

2. The semiconductor circuit system according to claim 1, wherein:
   said plurality of register circuits comprises at least one set of registers and at least one set of data registers, and
   said specific register circuit includes said set of registers.

3. The semiconductor circuit system according to claim 2, wherein each of said registers outputs a pulse signal to a corresponding one of said data registers when said first signal is supplied, such that data are written in a corresponding one of said data registers, and propagates said first signal to a next one of said registers which is connected to said register, and
   a last one of said registers outputs said first signal as said second signal.

4. The semiconductor circuit system according to claim 1, wherein said control circuit comprises:
   a first latch which latches said second signal;
   a second latch which is set in response to said third signal and is reset in response to said second signal latched by said first latch; and a switch which activates said plurality of differential input circuits when said second latch is set and inactivates said plurality of differential input circuits when said second latch is reset.

5. The semiconductor circuit system according to claim 1, wherein said n circuit sections are respectively provided on different semiconductor chips.

6. A semiconductor circuit comprising:
a plurality of differential input circuits;
a plurality of register circuits connected to output terminals of said plurality of differential input circuits, respectively; and
a control circuit including a latch circuit, said control circuit connected with at least one of said plurality of register circuits as a specific register circuit and said plurality of differential input circuits,
wherein said specific register circuit executes a predetermined operation using a first signal outputted from a corresponding one of said plurality of differential input circuits, and outputs a second signal to said latch circuit when the operation ends, and
said control circuit activates said plurality of differential input circuits in response to a third signal to operate and stops the operations of said plurality of differential input circuits in response to said second signal.

7. The semiconductor circuit according to claim 6, wherein said plurality of register circuits comprises at least one set of registers and at least one set of data registers, and
said specific register circuit includes said set of registers.

8. The semiconductor circuit according to claim 7, wherein each of said registers outputs a pulse signal to a corresponding one of said data registers when said first signal is supplied, such that data are written in a corresponding one of said data registers, and propagates said first signal to a next one of said registers which is connected to said register, and
a last one of said registers outputs said first signal as said second signal.

9. The semiconductor circuit according to claim 6, wherein said control circuit comprises:
a first latch which latches said second signal;
a second latch which is set in response to said third signal and is reset in response to said second signal latched by said first latch; and
a switch which activates said plurality of differential input circuits when said second latch is set and inactivates said plurality of differential input circuits when said second latch is reset.

10. A liquid crystal display apparatus, comprising:
a liquid crystal display panel;
a horizontal drive unit; and
a vertical drive unit,
wherein said horizontal drive unit further comprises:
a first signal line; and
n circuit sections, where n is an integer greater than 2, each of said n circuit sections having an input terminal and an output terminal, input terminals of only predetermined k ones of said n circuit sections are connected to said first signal line, where k is an integer equal to or greater than 2 and less than n, and said output terminal of an $m^{th}$ one of said n circuit sections is connected to said input terminal of an $(m+k)^{th}$ one of said n circuit sections, where m is an integer varying between 1 and n−k, such that k of said circuit sections are active at a given time, wherein each of said n circuit sections comprises:
a plurality of differential input circuits;
a plurality of register circuits connected to output terminals of said plurality of differential input circuits, respectively; and
a control circuit including a latch circuit, said control circuit connected with at least one of said plurality of register circuits as a specific register circuit and said plurality of differential input circuits,
wherein said specific register circuit executes a predetermined operation using a first signal outputted from a corresponding one of said plurality of differential input circuits, and outputs a second signal to said latch circuit when the operation ends, and
said control circuit activates said plurality of differential input circuits in response to a third signal to operate and stops the operations of said plurality of differential input circuits in response to said second signal.

11. The apparatus according to claim 10, wherein said control circuit comprises:
a first latch which latches said second signal;
a second latch which is set in response to said third signal and is reset in response to said second signal latched by said first latch; and
a switch which activates said plurality of differential input circuits when said second latch is set and inactivates said plurality of differential input circuits when said second latch is reset.

12. A semiconductor device, comprising:
an input terminal;
a plurality of differential input circuits;
a plurality of register circuits provided for outputs of said plurality of differential input circuits, respectively;
a flip-flop circuit configured to latch an output of one register circuit of a predetermined stage among said plurality of register circuits; and
a latch circuit connected with said input terminal and said flip-flop circuit,
wherein:
said one register circuit of the predetermined stage carries out a predetermined operation by using a first output signal outputted from one of said plurality of differential input circuit corresponding to said one register circuit, and outputs a second output signal to said flip-flop circuit after the predetermined operation is ended,
said flip-flop circuit latches said second output signal, and
said latch circuit starts said plurality of differential input circuits in response to an input signal from said input terminal, and stops operations of said plurality of differential input circuits in response to said second output signal latched by said flip-flop circuit.

* * * * *